(12) United States Patent
Ye (10) Patent No.: US 9,960,255 B2
(45) Date of Patent: May 1, 2018

(54) METHOD FOR MANUFACTURING THIN FILM TRANSISTOR

(71) Applicant: WUHAN CHINA STAR OPTOELECTRONICS TECHNOLOGY CO., LTD., Wuhan, Hubei (CN)

(72) Inventor: Jiangbo Ye, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 96 days.

(21) Appl. No.: 15/128,112

(22) PCT Filed: Jun. 12, 2016

(86) PCT No.: PCT/CN2016/085495
§ 371 (c)(1),
(2) Date: Sep. 22, 2016

(87) PCT Pub. No.: WO2017/197679
PCT Pub. Date: Nov. 23, 2017

(65) Prior Publication Data
US 2018/0083123 A1    Mar. 22, 2018

(30) Foreign Application Priority Data
May 17, 2016 (CN) .......................... 2016 1 0325163

(51) Int. Cl.
*H01L 29/66* (2006.01)
*H01L 21/265* (2006.01)
*H01L 21/311* (2006.01)
*H01L 21/3213* (2006.01)

(52) U.S. Cl.
CPC .. *H01L 29/66757* (2013.01); *H01L 21/26513* (2013.01); *H01L 21/31138* (2013.01); *H01L 21/32135* (2013.01); *H01L 21/32139* (2013.01)

(58) Field of Classification Search
CPC ......... H01L 29/66757; H01L 21/26513; H01L 21/31138
See application file for complete search history.

(56) References Cited

U.S. PATENT DOCUMENTS

| 4,149,904 A | * | 4/1979 | Jones | ..................... H01L 21/266 148/DIG. 143 |
| 4,599,118 A | * | 7/1986 | Han | ..................... H01L 21/265 148/DIG. 82 |
| 5,650,343 A | * | 7/1997 | Luning | ................. H01L 21/266 257/E21.205 |

(Continued)

*Primary Examiner* — Errol Fernandes
(74) *Attorney, Agent, or Firm* — Mark M. Friedman (57) ABSTRACT

A method for manufacturing a thin film transistor is provided. The method comprises depositing sequentially a gate insulating layer and a gate metal layer on a semiconductor substrate; etching the gate metal layer uncovered by the first photoresist pattern; implementing a first ion implantation on the semiconductor substrate; etching a side wall of the first photoresist pattern; implementing a second ion implantation on the semiconductor substrate to form a source and a drain. The source and the drain include a heavily doped drain region and a lightly doped drain region.

20 Claims, 5 Drawing Sheets

(56) References Cited

U.S. PATENT DOCUMENTS 5,929,496 A * 7/1999 Gardner ............... H01L 21/223
257/346
2001/0031519 A1 * 10/2001 Ayres ............... H01L 29/66757
438/149

* cited by examiner

METHOD FOR MANUFACTURING THIN FILM TRANSISTOR

FIELD OF THE INVENTION

The present invention relates to a technical field of displays, and in particular to a method for manufacturing a thin film transistor.

BACKGROUND OF THE INVENTION

A method for manufacturing a low-temperature polycrystalline silicon thin film is a new generation method of a thin film transistor liquid crystal display, which is an a-Si film changed to a polysilicon thin film layer through aLaser annealing process. The polysilicon thin film layer is used to form thin film transistors of data lines and scan lines in the liquid crystal display panel. The moving velocity of electrons of polysilicon thin film transistors is one hundred times faster than amorphous silicon elements. Therefore, rapid response of the liquid crystal display panel, highlight display, and high resolution can be implemented.

Refer to FIGS. 1A to 1F, which are schematic views of a traditional method for manufacturing the thin film transistor.

Figure 1A:
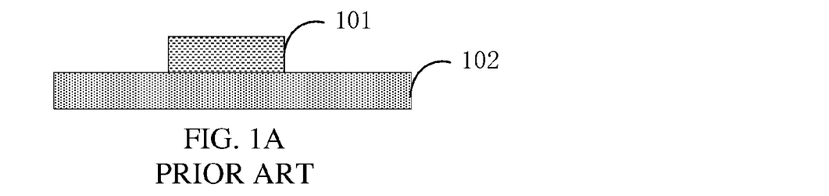
FIGS. 1A to 1F are schematic views of a traditional method for manufacturing the thin film transistor.
Figure 1B:
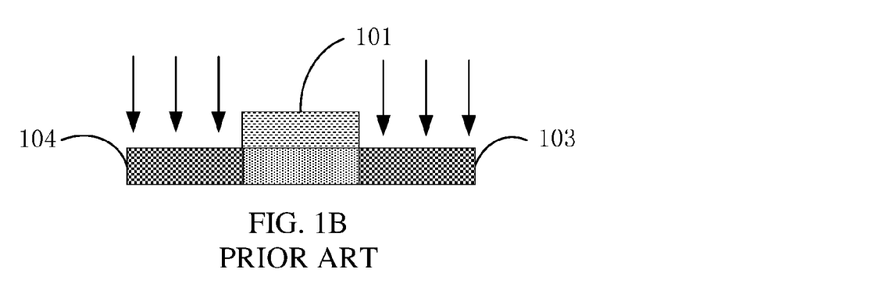

Refer to FIG. 1A, a first photoresist pattern 101 is formed on a semiconductor substrate 102. The the semiconductor substrate 102 implements a first ion implantation through using the first photoresist pattern as a mask. Refer to FIG. 1B, an area uncovered by the first photoresist pattern 101 forms a preparation source 104 and a preparation drain 103.

Figure 1C:
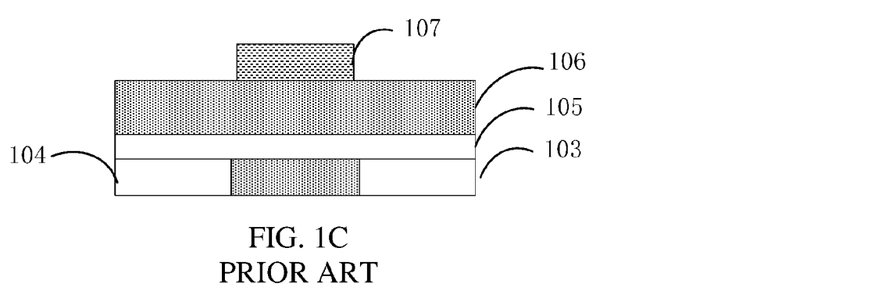

Refer to FIG. 1C, the first photoresist pattern 101 is removed, and a gate insulating layer 105 and a gate metal layer 106 are sequentially deposited on the semiconductor substrate 102, and a second photoresist pattern 107 is formed on the gate metal layer 106.

Figure 1D:
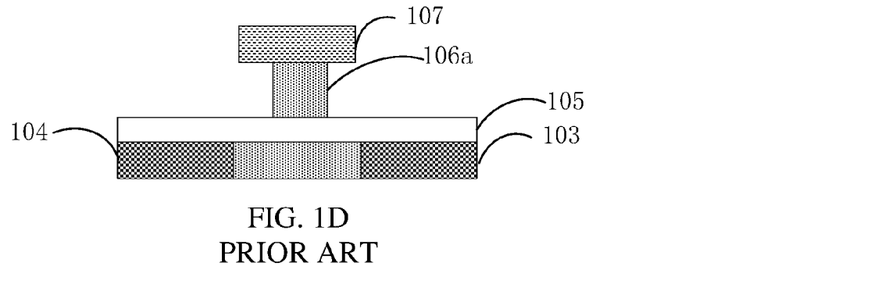
Figure 1E:
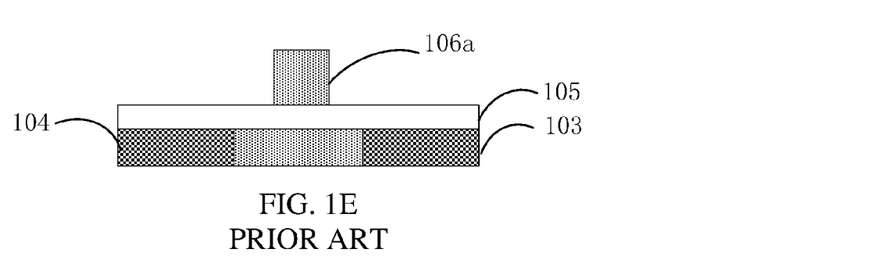

Refer to FIG. 1D, the gate metal layer 106 is etched. Specifically, the gate metal layer 106 uncovered by the first photoresist pattern 101 is etched. As the etching time passes, a side wall of the gate metal layer 106 is etched gradually to form a new gate metal layer 106a, and then the second photoresist pattern 107 is removed in FIG. 1E.

Figure 1F:
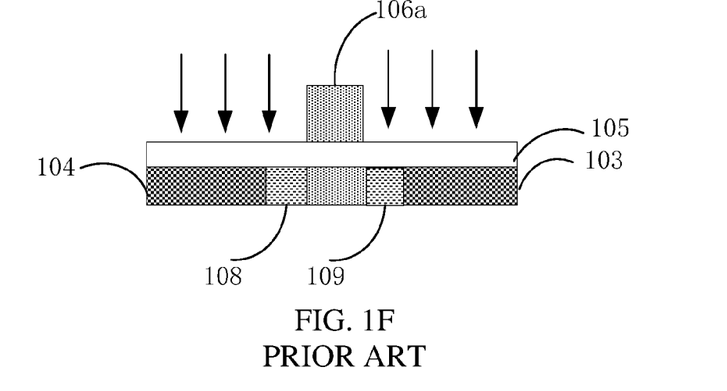

Refer to FIG. 1F, a source and a drain are formed by implementing a second ion implantation, wherein the source and the drain include a heavily doped drain region 103, 104 and a lightly doped drain region 109, 108.

As described above in the method for manufacturing a thin film transistor, the lightly doped drain region is formed by forming two photoresist patterns, which is a complicated process, and has long production cycle, and is not good for production. As a result, it is necessary to provide method for manufacturing a thin film transistor, which is a simple process, and has a small negative effect for the uniformity of ion implantation, so that the electron mobility of the heavily doped drain region and the lightly doped drain region can be enhanced.

SUMMARY OF THE INVENTION

An object of the present invention is to provide a method for manufacturing a thin film transistor, which solves the problem of the conventional method for manufacturing a thin film transistor, which has a complicated process, a long production cycle and a large negative effect for the uniformity of ion implantation, that may lower the electron mobility of the heavily doped drain region and the lightly doped drain region.

To achieve the above objects, the present invention provides a method for manufacturing a thin film transistor, comprising steps of:

depositing sequentially a gate insulating layer and a gate metal layer on a semiconductor substrate;

forming a first photoresist pattern on the gate metal layer, which comprises: coating a photoresist on the gate metal layer; exposing the photoresist through a mask; forming the first photoresist pattern after developing and etching the gate metal layer uncovered by the first photoresist pattern to form a gate electrode, wherein a width of the gate electrode is less than a width of the first photoresist pattern;

forming a preparation source and a preparation drain by implementing a first ion implantation on the semiconductor substrate through using the first photoresist pattern as a mask; etching a side wall of the first photoresist pattern by using oxygen to form a second photoresist pattern, wherein a width of the second photoresist pattern is less than the width of the first photoresist pattern; and forming a source and a drain by implementing a second ion implantation on the semiconductor substrate through using the second photoresist pattern as a mask, wherein the source and the drain include a heavily doped drain region and a lightly doped drain region.

In one embodiment of the present invention, the step of etching the gate metal layer uncovered by the first photoresist pattern comprises: implementing a first etching to the gate metal layer, so as to form a preliminary gate electrode; and implementing a second etching on the preliminary gate electrode, so as to form the gate electrode.

In one embodiment of the present invention, an etching rate of the first etching is greater than an etching rate of the second etching.

In one embodiment of the present invention, the first etching is implemented by using sulfur fluoride and oxygen.

In one embodiment of the present invention, the second etching is implemented by using chlorine and oxygen.

In one embodiment of the present invention, the first photoresist pattern is etched by using oxygen.

To achieve the above objects, the present invention provides a method for manufacturing a thin film transistor, comprising steps of:

depositing sequentially a gate insulating layer and a gate metal layer on a semiconductor substrate;

forming a first photoresist pattern on the gate metal layer, and etching the gate metal layer uncovered by the first photoresist pattern to form a gate electrode, wherein a width of the gate electrode is less than a width of the first photoresist pattern;

forming a preparation source and a preparation drain by implementing a first ion implantation on the semiconductor substrate through using the first photoresist pattern as a mask;

etching a side wall of the first photoresist pattern to form a second photoresist pattern, wherein a width of the second photoresist pattern is less than the width of the first photoresist pattern; and forming a source and a drain by implementing a second ion implantation on the semiconductor substrate through using the second photoresist pattern as a mask, wherein the source and the drain include a heavily doped drain region and a lightly doped drain region.

In one embodiment of the present invention, the step of forming the first photoresist pattern on the gate metal layer comprises: coating a photoresist on the gate metal layer;

exposing the photoresist through a mask; and forming the first photoresist pattern after developing.

In one embodiment of the present invention, the step of etching the gate metal layer uncovered by the first photoresist pattern comprises: implementing a first etching on the gate metal layer, so as to form a preliminary gate electrode; and implementing a second etching on the preliminary gate electrode, so as to form the gate electrode.

In one embodiment of the present invention, an etching rate of the first etching is greater than an etching rate of the second etching.

In one embodiment of the present invention, the first etching is implemented by using sulfur fluoride and oxygen.

In one embodiment of the present invention, the second etching is implemented by using chlorine and oxygen.

In one embodiment of the present invention, the first photoresist pattern is etched by using oxygen.

In one embodiment of the present invention, a width of the lightly doped drain region is equal to the smaller of the width of the second photoresist pattern and the width of the gate electrode.

In one embodiment of the present invention, the gate insulating layer is a silicon nitride layer, a silicon oxide layer, or a composite layer of the silicon nitride layer and the silicon oxide layer.

In one embodiment of the present invention, the silicon nitride layer is disposed over the silicon oxide layer.

To achieve the above objects, the present invention provides a method for manufacturing a thin film transistor, comprising steps of:

depositing sequentially a gate insulating layer and a gate metal layer on a semiconductor substrate, wherein the gate insulating layer is a silicon nitride layer, a silicon oxide layer, or a composite layer of the silicon nitride layer and the silicon oxide layer;

forming a first photoresist pattern on the gate metal layer, and etching the gate metal layer uncovered by the first photoresist pattern to form a gate electrode, wherein a width of the gate electrode is less than a width of the first photoresist pattern;

forming a preparation source and a preparation drain by implementing a first on implantation on the semiconductor substrate through using the first photoresist pattern as a mask;

etching a side wall of the first photoresist pattern by using oxygen to form a second photoresist pattern, wherein a width of the second photoresist pattern is less than the width of the first photoresist pattern; and forming a source and a drain by implementing a second ion implantation on the semiconductor substrate through using the second photoresist pattern as a mask, wherein the source and the drain include a heavily doped drain region and a lightly doped drain region; and a width of the lightly doped drain region is equal to the smaller of the width of the second photoresist pattern and the width of the gate electrode.

In one embodiment of the present invention, the step of forming the first photoresist pattern on the gate metal layer comprises: coating a photoresist on the gate metal layer; exposing the photoresist through a mask; and forming the first photoresist pattern after developing.

In one embodiment of the present invention, the step of etching the gate metal layer uncovered by the first photoresist pattern comprises: implementing a first etching on the gate metal layer, so as to form a preliminary gate electrode; and implementing a second etching on the preliminary gate electrode, so as to form the gate electrode.

In one embodiment of the present invention, the silicon nitride layer is disposed over the silicon oxide layer.

The present invention provides a method for manufacturing a thin film transistor, the heavily doped drain region and the lightly doped drain region are formed by forming the photoresist pattern. Thus, the manufacturing process is simplified, and the production cycle can be reduced. The gate metal layer avoids the second etching through etching on the side wail of the photoresist pattern, and the negative effect of the uniformity by implementing the on implantation is reduced. Thus, the electron mobility of the heavily doped drain region and the lightly doped drain region can be enhanced.

DESCRIPTION OF THE DRAWINGS

In order to more clearly illustrate the embodiments or the prior art technical solutions embodiment of the present invention, will implement the following figures for the cases described in the prior art or require the use of a simple introduction. Obviously, the following description of the drawings are only some of those of ordinary skill in terms of creative effort without precondition, you can also obtain other drawings based on these drawings embodiments of the present invention.

DETAILED DESCRIPTION OF THE PREFERRED EMBODIMENTS

The structure and the technical means adopted by the present invention to achieve the above and other objects can be best understood by referring to the following detailed description of the preferred embodiments and the accompanying drawings. Furthermore, directional terms described by the present invention, such as upper, lower, front, back, left, right, inner, outer, side, longitudinal/vertical, transverse/horizontal, etc., are only directions by referring to the accompanying drawings, and thus the used directional terms are used to describe and understand the present invention, but the present invention is not limited thereto.

Below with reference to the accompanying drawings and described in detail with an embodiment of the present invention.

It is improved that a complex process of a thin film transistor resulting a long production cycle.

Refer to FIGS. 2A to 2F, which are a flow chart of a method for manufacturing the thin film transistor of the present invention.

Figure 2A:
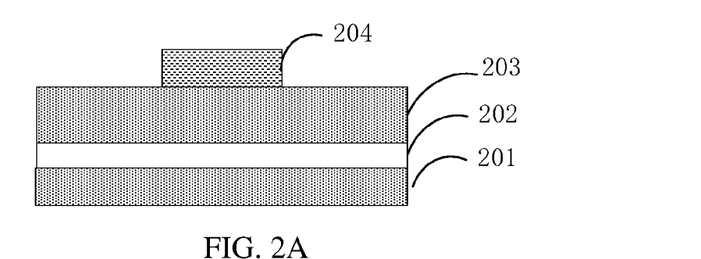
FIGS. 2A to 2F are schematic views of a method for manufacturing the thin film transistor of the present invention.

Refer to FIGS. 2A, a gate insulating layer 202 and a gate metal layer 203 are deposited sequentially on a semiconductor substrate 201, and a first photoresist pattern 204 is formed on the gate metal layer 203.

Figure 2B:
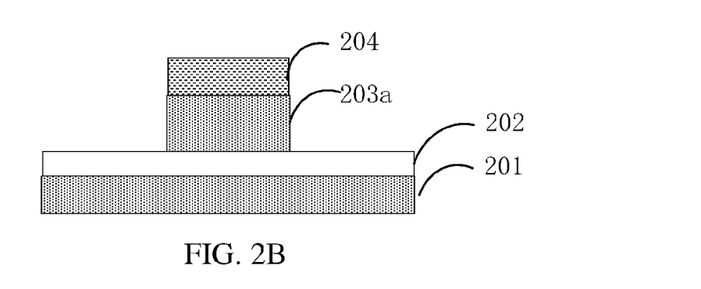

Refer to FIGS. 2B, the gate metal layer 203 is etched to form a new gate metal layer 203a. Specifically, the gate metal layer 203 is fast etched by using sulfur fluoride and oxygen, and the gate metal layer 203 is slowly etched by using chlorine and oxygen. In the etching process, a part of the gate insulating layer 202 is etched easily.

Figure 2C:
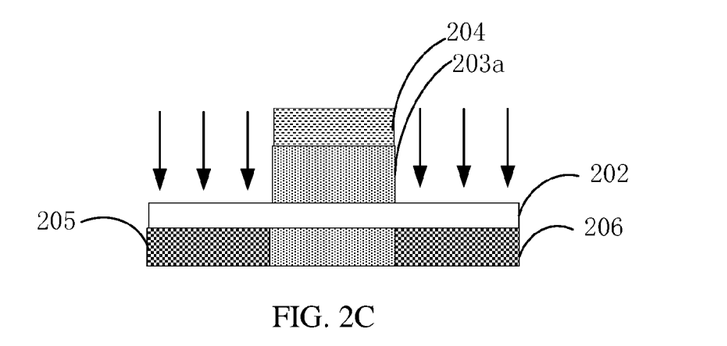
Figure 2D:
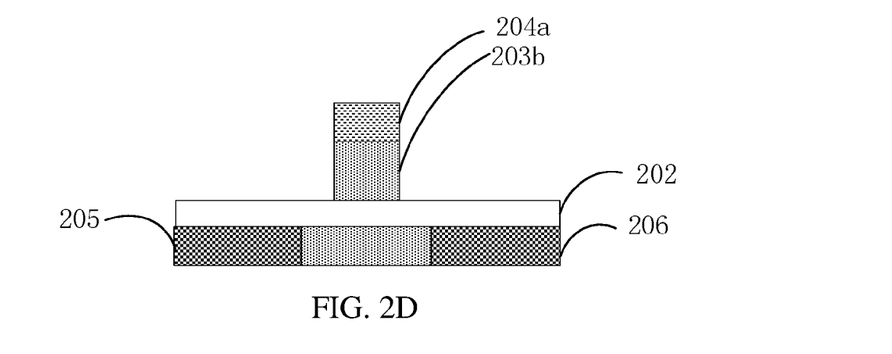

Refer to FIG. 2C, a preparation source 205 and a preparation drain 206 are formed by implementing a first ion implantation to the semiconductor substrate 201. Refer to FIG. 2D, the gate metal layer 203a is etched again. Specifically, the gate metal layer 203a is fast etched by using sulfur fluoride and oxygen, and the gate metal layer 203a is slowly etched by using chlorine and oxygen. As time passes, a part of a side wall of the first photoresist pattern 204 is etched to form a new first photoresist pattern 204a, and a new gate metal layer 203b.

Figure 2E:
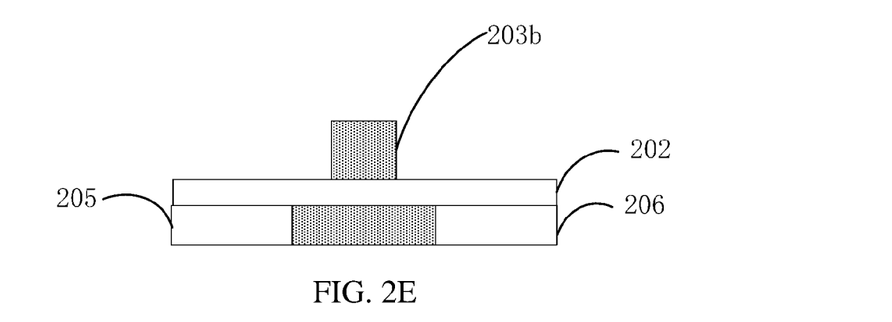
Figure 2F:
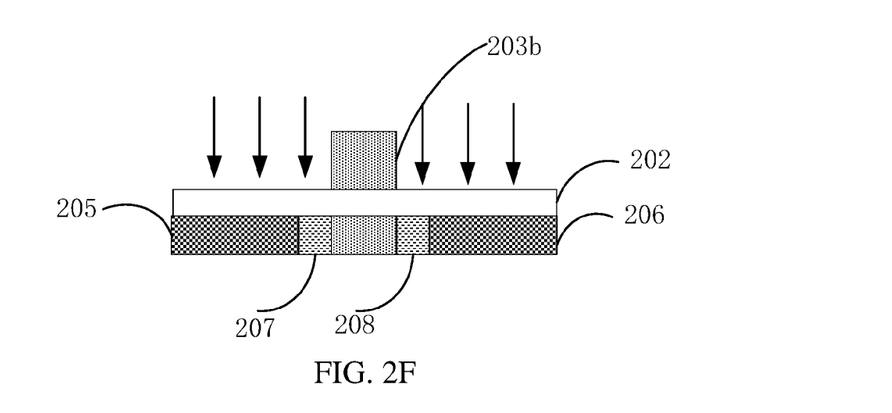

Refer to FIG. 2E, the first photoresist pattern 204a is removed. Refer to FIG. 2F, a source and a drain are formed by implementing a second ion implantation to the semiconductor substrate 201, wherein the source and the drain include a heavily doped drain region 205, 206 and a lightly doped drain region 207, 208.

As the method for manufacturing a thin film transistor, the lightly doped drain region is formed through forming a photoresist pattern, can be simplified fabrication process, but implemented twice etching. The surface of the gate insulating layer has the problem of insufficient homogeneity during the process of etching, so that the ion has the problem of insufficient homogeneity when the semiconductor substrate implements the ion implantation. The gate metal layer is etched again, and the surface of the gate insulating layer has the problem of insufficient homogeneity during the process of etching, so that the ion has the problem of insufficient homogeneity when the semiconductor substrate implements the second ion implantation. The electron mobility of the heavily doped drain region and the lightly doped drain region are lowered by both of the problems of insufficient homogeneity.

Figure 4:
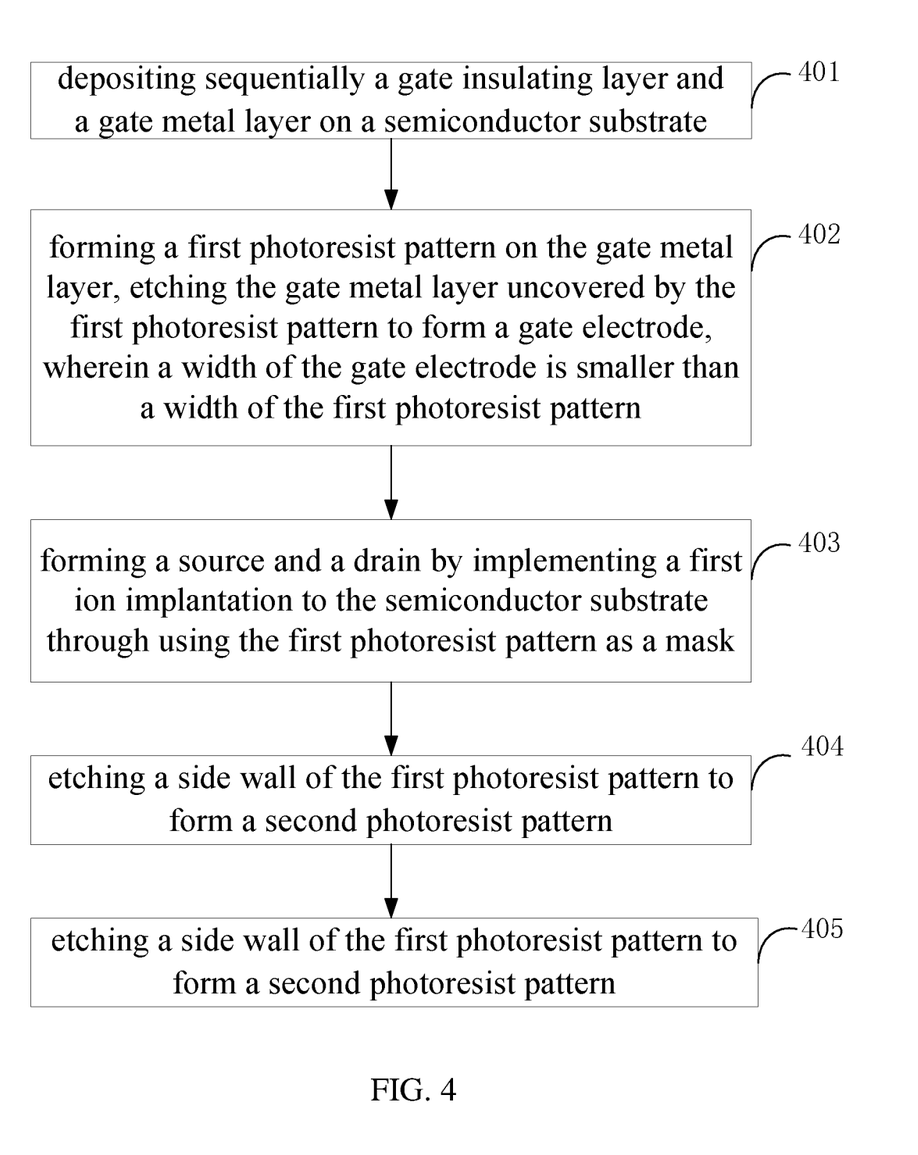
FIG. 4 is a flow chart of a traditional method for manufacturing the thin film transistor.

FIG. 4 is a flow chart of a method for manufacturing the thin film transistor, which has a step 401 to a step 405:

In the step 401, a gate insulating layer 302 and a gate metal layer 303 are deposited sequentially on a semiconductor substrate 301.

In the step 402, a first photoresist pattern 304 is formed on the gate metal layer 303, the gate metal layer 303 uncovered by the first photoresist pattern 304 being etched to form a gate electrode, wherein a width of the gate electrode 303a is less than a width of the first photoresist pattern 304.

In the step 403, a preparation source 306 and a preparation drain 305 are formed by implementing a first ion implantation on the semiconductor substrate 301 through using the first photoresist pattern 304 as a mask.

In the step 404, a side wall of the first photoresist pattern 304 is etched to form a second photoresist pattern 304a, wherein a width of the second photoresist pattern 304a is less than the width of the first photoresist pattern 304.

In the step 405, a source and a drain are formed by implementing a second ion implantation to the semiconductor substrate 301 through using the second photoresist pattern 304a as a mask, wherein the source and the drain include a heavily doped drain region 305, 306 and a lightly doped drain region 307, 308.

Before the step 401, a semiconductor substrate is first provided. In the embodiment, a buffer layer is disposed on a substrate, and an amorphous silicon layer is disposed on the buffer layer, and a polysilicon is formed by a process, thus a semiconductor substrate with a lightly doped drain region structure is made.

Specifically, the substrate is cleaned by a process, the buffer layer is formed on the substrate by Plasma Enhanced Chemical Vapor Deposition (PECVD) to prevent harmful substances of the substrate, such as alkali metal ions, from negatively affecting the performance of the polysilicon layer. The buffer layer is processed a pre-washing before depositing, and the buffer layer is formed to process an annealing to improve the quality of the buffer layer.

In the step 401, the amorphous silicon layer is deposited on the buffer layer by PECVD, and processed a dehydrogenation to prevent the hydrogen explosion phenomenon and reducing defect density. The amorphous silicon layer is processed a polycrystalline by Low Temperature Poly-silicon (LTPS) after the dehydrogenation. The polysilicon layer 303 commonly adopts ELA, MIC, or SPC. A surface of the polysilicon layer 303 is treated to reduce the surface roughness of the polysilicon layer 303, and to improve the performance of a device.

Figure 3A:
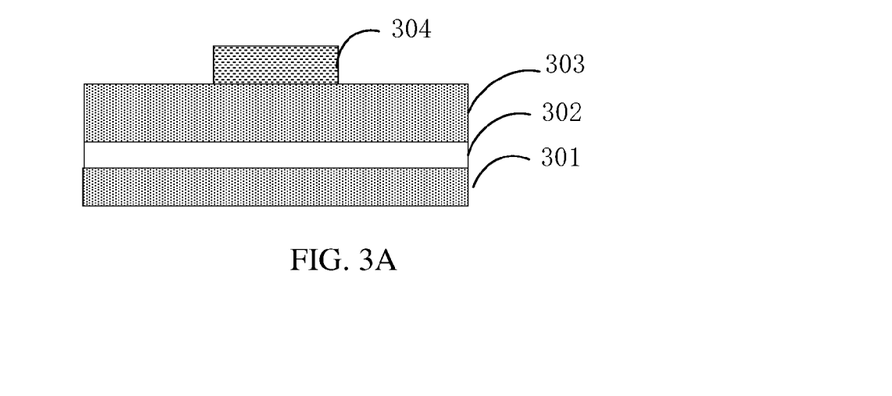
FIGS. 3A to 3E are schematic views of a method for manufacturing the thin film transistor of the present invention.

Refer to FIG. 3A, the gate insulating layer 202 of the embodiment of the present invention includes a silicon nitride layer, a silicon oxide layer, or a composite layer of the silicon nitride layer and the silicon oxide layer. The silicon oxide layer is more connected with the surface of the polysilicon layer, and the silicon nitride layer is disposed on the polysilicon layer.

In the step 402, the first photoresist pattern 304 is formed on the gate metal layer 303. Specifically, a photoresist is coated on the gate metal layer 304, and the photoresist is exposed by the mask to form the first photoresist pattern 304.

Figure 3B:
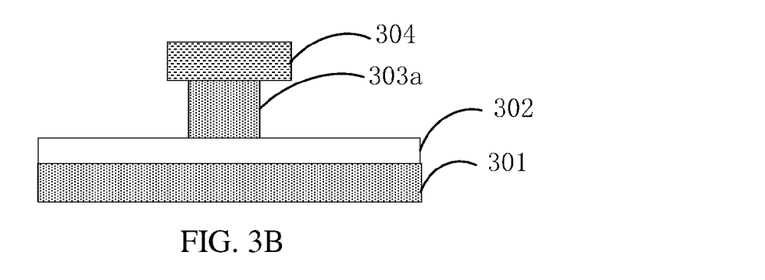

In the step 402, the gate metal layer 303 uncovered by the first photoresist pattern 304 is etched to form a gate electrode in FIG. 33. Specifically, the the gate metal layer 303 is implemented a first etching to form a gate electrode by adopting a dry etching. The etching preferably adopts sulfur hexafluoride and oxygen. The etching speed of sulfur hexafluoride and oxygen is fast to etch the gate metal layer, and the process time can be reduced effectively. The the gate metal layer 303 implements a second etching to form a gate electrode 303a by adopting dry etching. The etching preferably adopts chlorine and oxygen. The etching speed of chlorine and oxygen is slow, and the surface of the gate insulating layer 302 can be kept without negatively affecting the uniformity of the subsequent ion implantation.

The first etching is the gate metal layer 303 uncovered by the first photoresist pattern 304 etching, the second etching is a side of the gate electrode uncovered by the first photoresist pattern 304 etching, wherein a width of the gate electrode 303a is less than a width of the first photoresist pattern 304.

Figure 3C:
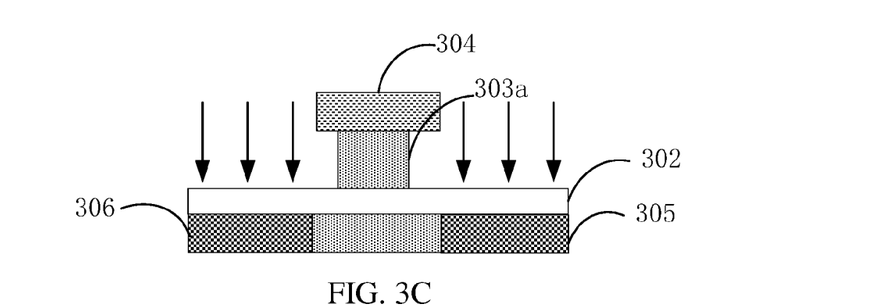

In the step 403, the preparation source 306 and the preparation drain 305 are formed by implementing a first ion implantation to the semiconductor substrate 301 through using the first photoresist pattern 304 as the mask in FIG. 3C. Specifically, the semiconductor substrate 301 covered by the first photoresist pattern 304 cannot implement the ion implantation, and the gate insulating layer 302 is formed at two sides of the gate metal layer after etching. The ion can be implanted on the semiconductor substrate 301 through the gate insulating layer 302, and the surface of the gate insulating layer 302 can be kept by the first etching and the second etching. Thus the ion of the preparation source 306 and the preparation drain 305 is more uniform after ion implantation.

The semiconductor substrate is covered by the first photoresist pattern 304 near the preparation source 306 and the preparation drain 305, which is not implemented the ion implantation. A part of the gate metal layer 303 is etched after the second etching, and the gate insulating layer 302 is exposed to form a lightly doped drain region.

Figure 3D:
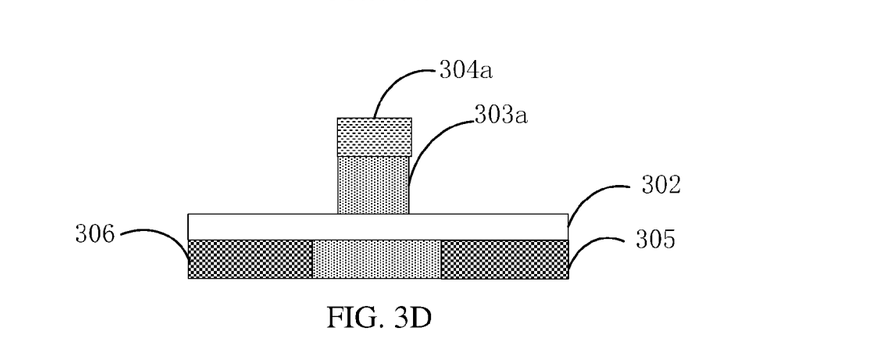

In the step 404, a side wall of the first photoresist pattern 304 is etched to form a second photoresist pattern 304a in FIG. 3D. Specifically, the first photoresist pattern 304 is etched by using oxygen. In the process of etching, the oxygen is more sensitive for the first photoresist pattern 304, and only affecting to the second photoresist pattern 304. Thus, the surface uniformity of the gate insulating layer 302 is not influenced by the etching, and the uniformity is better after implementing the ion implantation on semiconductor substrate 301, and the electron mobility of the heavily doped drain region and the lightly doped drain region is better.

A condition of the lightly doped drain region is created by etching the side of the first photoresist pattern 304, and a side of the first photoresist pattern 304 impeding ion implantation to the semiconductor substrate can be removed. A width of the lightly doped drain region is equal to the smaller of the width of the second photoresist pattern 304a and the width of the gate electrode 303a.

Figure 3E:
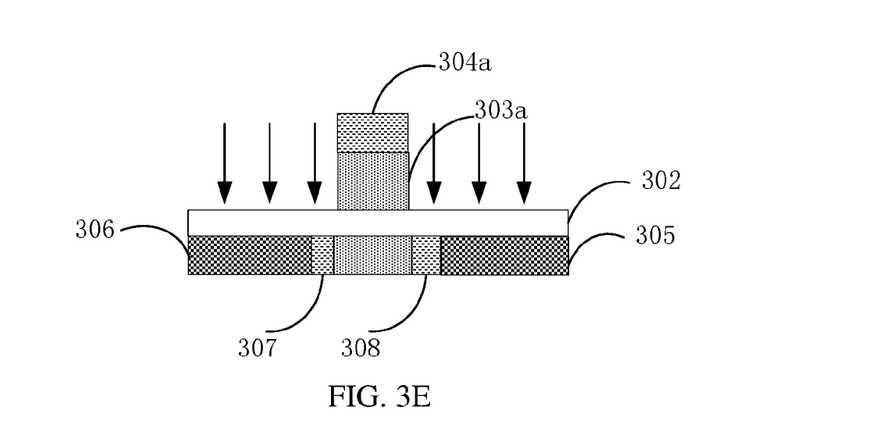

In the step 405, a source and a drain are etched by implementing a second ion implantation to the semiconductor substrate 301 through using the second photoresist pattern 304a as a mask in FIG. 3E, wherein the source and the drain include a heavily doped drain region 305, 306 and a lightly doped drain region 307, 308.

The present invention provides a method for manufacturing a thin film transistor, the heavily doped drain region and the lightly doped drain region are formed by forming the photoresist pattern. So that the process of the manufacture is simplified, and the production cycle can be reduced. The gate metal layer avoids the second etching through etching on the side wall of the photoresist pattern, and the negative effect of the uniformity by implementing the ion implantation is reduced. Thus, the electron mobility of the heavily doped drain region and the lightly doped drain region can be enhanced.

The present invention has been described with preferred embodiments thereof and it is understood that many changes and modifications to the described embodiments can be carried out without departing from the scope and the spirit of the invention that is intended to be limited only by the appended claims.

What is claimed is:

1. A method for manufacturing a thin film transistor, comprising steps of:
  depositing sequentially a gate insulating layer and a gate metal layer on a semiconductor substrate;
  forming a first photoresist pattern on the gate metal layer, comprising:
    coating a photoresist on the gate metal layer;
    exposing the photoresist through a mask;
    forming the first photoresist pattern after developing; and
    etching the gate metal layer uncovered by the first photoresist pattern to form a gate electrode, wherein a width of the gate electrode is less than a width of the first photoresist pattern;
  forming a preparation source and a preparation drain by implementing a first ion implantation on the semiconductor substrate through using the first photoresist pattern as a mask;
  etching a side wall of the first photoresist pattern to form a second photoresist pattern, wherein a width of the second photoresist pattern is less than the width of the first photoresist pattern; and
  forming a source and a drain by implementing a second ion implantation to the semiconductor substrate through using the second photoresist pattern as a mask, wherein the source and the drain include a heavily doped drain region and a lightly doped drain region, and a width of the lightly doped drain region is equal to the smaller of the width of the second photoresist pattern and the width of the gate electrode.

2. The method for manufacturing the thin film transistor according to claim 1, wherein the step of etching the gate metal layer uncovered by the first photoresist pattern comprises:
  implementing a first etching on the gate metal layer, so as to form a preliminary gate electrode; and
  implementing a second etching on the preliminary gate electrode, so as to form the gate electrode.

3. The method for manufacturing the thin film transistor according to claim 2, wherein an etching rate of the first etching is greater than an etching rate of the second etching.

4. The method for manufacturing the thin film transistor according to claim 3, wherein the first etching is implemented by using sulfur fluoride and oxygen.

5. The method for manufacturing the thin film transistor according to claim 3, wherein the second etching is implemented by using chlorine and oxygen.

6. The method for manufacturing the thin film transistor according to claim 1, wherein the first photoresist pattern is etched by using oxygen.

7. A method for manufacturing a thin film transistor, comprising steps of:
  depositing sequentially a gate insulating layer and a gate metal layer on a semiconductor substrate;
  forming a first photoresist pattern on the gate metal layer, and etching the gate metal layer uncovered by the first photoresist pattern to form a gate electrode, wherein a width of the gate electrode is less than a width of the first photoresist pattern;
  forming a preparation source and a preparation drain by implementing a first ion implantation to the semiconductor substrate through using the first photoresist pattern as a mask;
  etching a side wall of the first photoresist pattern to form a second photoresist pattern, wherein a width of the second photoresist pattern is less than the width of the first photoresist pattern; and
  forming a source and a drain by implementing a second ion implantation to the semiconductor substrate through using the second photoresist pattern as a mask, wherein the source and the drain include a heavily doped drain region and a lightly doped drain region.

8. The method for manufacturing the thin film transistor according to claim 7, wherein the step of forming the first photoresist pattern on the gate metal layer comprises:
  coating a photoresist on the gate metal layer;
  exposing the photoresist through a mask; and
  forming the first photoresist pattern after developing.

9. The method for manufacturing the thin film transistor according to claim 8, wherein the step of etching the gate metal layer uncovered by the first photoresist pattern comprises:
  implementing a first etching on the gate metal layer, so as to form a preliminary gate electrode; and
  implementing a second etching on the preliminary gate electrode, so as to form the gate electrode.

10. The method for manufacturing the thin film transistor according to claim 9, wherein an etching rate of the first etching is greater than an etching rate of the second etching.

11. The method for manufacturing the thin film transistor according to claim 10, wherein the first etching is implemented by using sulfur fluoride and oxygen.

12. The method for manufacturing the thin film transistor according to claim 10, wherein the second etching is implemented by using chlorine and oxygen.

13. The method for manufacturing the thin film transistor according to claim 7, wherein the first photoresist pattern is etched by using oxygen.

14. The method for manufacturing the thin film transistor according to claim 7, wherein a width of the lightly doped drain region is equal to the smaller of the width of the second photoresist pattern and the width of the gate electrode.

15. The method for manufacturing the thin film transistor according to claim 7, wherein the gate insulating layer is a silicon nitride layer, a silicon oxide layer, or a composite layer of the silicon nitride layer and the silicon oxide layer.

16. The method for manufacturing the thin film transistor according to claim 15, wherein the silicon nitride layer is disposed over the silicon oxide layer.

17. A method for manufacturing a thin film transistor, comprising steps of:
   depositing sequentially a gate insulating layer and a gate metal layer on a semiconductor substrate, wherein the gate insulating layer is a silicon nitride layer, a silicon oxide layer, or a composite layer of the silicon nitride layer and the silicon oxide layer;
   forming a first photoresist pattern on the gate metal layer, and etching the gate metal layer uncovered by the first photoresist pattern to form a gate electrode, wherein a width of the gate electrode is less than a width of the first photoresist pattern;
   forming a preparation source and a preparation drain by implementing a first ion implantation to the semiconductor substrate through using the first photoresist pattern as a mask;
   etching a side wall of the first photoresist pattern by using oxygen to form a second photoresist pattern, wherein a width of the second photoresist pattern is less than the width of the first photoresist pattern; and
   forming a source and a drain by implementing a second ion implantation to the semiconductor substrate through using the second photoresist pattern as a mask, wherein the source and the drain include a heavily doped drain region and a lightly doped drain region.

18. The method for manufacturing the thin film transistor according to claim 17, wherein the step of forming the first photoresist pattern on the gate metal layer comprises:
   coating a photoresist on the gate metal layer;
   exposing the photoresist through a mask; and
   forming the first photoresist pattern after developing.

19. The method for manufacturing the thin film transistor according to claim 18, wherein the step of etching the gate metal layer uncovered by the first photoresist pattern comprises:
   implementing a first etching to the gate metal layer, so as to form a preliminary gate electrode; and
   implementing a second etching to the preliminary gate electrode, so as to form the gate electrode.

20. The method for manufacturing the thin film transistor according to claim 17, wherein the silicon nitride layer is disposed over the silicon oxide layer.

* * * * *